United States Patent [19]
Gibson et al.

[11] Patent Number: 5,612,923
[45] Date of Patent: Mar. 18, 1997

[54] MULTI-PORT RANDOM ACCESS MEMORY

[75] Inventors: Garnet F. R. Gibson, Nepean; Steven W. Wood, Kanata, both of Canada

[73] Assignee: Northern Telecom Limited, Montreal, Canada

[21] Appl. No.: 644,081

[22] Filed: May 9, 1996

[51] Int. Cl.$^6$ ................................................. G11C 8/00
[52] U.S. Cl. ................ 365/230.05; 365/233; 365/230.06
[58] Field of Search ............................... 365/230.05, 233, 365/230.06, 230.01

[56] References Cited

U.S. PATENT DOCUMENTS

| | | | |
|---|---|---|---|
| 5,355,335 | 10/1994 | Katsumo | 365/230.05 X |
| 5,434,818 | 7/1995 | Byers et al. | 365/230.05 X |
| 5,473,574 | 12/1995 | Clemen et al. | 365/230.05 |

OTHER PUBLICATIONS

1985 IEEE International Solid-State Circuits Conference, SESSION III: Special Application Memories, "A 2K×9 Dual Port Memory", Barber et al., Feb. 1985, pp. 44–45 and 302.
1990 Symposium on VLSI Circuits, "Pipelined, Time-Sharing Access Technique for a Highly Integrated Multi-Port Memory", Tsuneo Matsumura et al, NTT LSI Laboratories, Feb. 1990, pp. 107–108.
IEEE Journal of Solid State Circuits, Endo et al. vol. 26, No. 4, Apr. 1991, "Pipelined, Time-Sharing Access Technique for an Integrated Multiport Memory", pp. 549–554.
IEEE Journal of Solid-State Circuits, vol. 28, No. 3, Mar. 1993, "A 180–MHz 0.8–μm BiCMOS Modular Memory Family of DRAM and Multiport SRAM", Allan L. Silburt et al, pp. 222–232.
Fujitsu Sci. Tech. J., 24, 4, pp. 293–300 (Dec. 1988), "Self–Timed RAM: STRAM", C. Ohno.

*Primary Examiner*—David C. Nelms
*Assistant Examiner*—Huan Hoang
*Attorney, Agent, or Firm*—George MacGregor

[57] ABSTRACT

Disclosed is a design detail for an innovative time multiplexed read port architecture implemented as part of a high-speed 9-port time slot interchange random access memory. It provides a practical, high-speed, low-power and area efficient read port structure to allow eight random access reads per clock cycle. Because all timing is internally generated from a single rising clock transition of a system clock signal, no special control or clocking is required externally to the memory.

18 Claims, 9 Drawing Sheets

MULTI-PORT RANDOM ACCESS MEMORY

TECHNICAL FIELD

The present invention relates to a multi-port random access memory.

BACKGROUND ART

Well known RAMs (random access memories) have at least one address port and include storage elements (core cells). In a paper by A. L. Silburt et al entitled "A 180-MHz 0.8-μm BiCMOS Modular Memory Family of DRAM and Multiport SRAM", IEEE Journal of Solid-State Circuits, Vol. 28, No. 3, March 1993, p. 222, at 227 and 228 show various RAM core arrays. In a paper by C. Ohno entitled "Self-Timed RAM: STRAM", FUJITSU Sci. Tech. J., 24, 4, December 1988, p. 293 shows a self-timed RAM which has synchronous operation and an on-chip write pulse generator.

In a paper by F. E. Barber et al, "A 2K×9 Dual Port Memory", ISSCC Dig. Tech. Papers, Feb. 1985, pp. 44–45 and in a paper by F. E. Barber et al, "A 200 ns 512×10 DUAL PORT RAM", Proc. Electron. Conf., vol. 36, Oct. 1982, pp. 380–382 disclose a single port RAM with two asynchronous address, data and control interfaces. Timing is controlled by arbitration between address latch enable signals. A memory access from port A is initiated by asserting the address latch enable signal "low" on port A, an access from port B is initiated by asserting the address latch enable signal "low" on port B. If port B attempts to access the memory while port A is actively accessing the memory, then an arbitration circuit will delay the port B access until the port A access is complete. In the RAM, asynchronous enables are used to initiate memory access.

In a paper by T. Matsumura et al, "Pipelined, Time-Sharing Access Technique for a Highly Integrated Multi-Port Memory", Symp. VLSI Circuits Dig. Tech. Papers, June 1990, pp. 107–108 and in a paper by K. Endo et al, "Pipelined, Time-Sharing Access Technique for an Integrated Multiport Memory", IEEE J. Solid-State Circuits, vol. 26, no. 4, pp. 549–554, April 1991 disclose a dual port memory with respect to a common clock (CLK) which is controlled by common write enable (WE) and chip select (CS) inputs. Likewise, ports 2 and 3 are synchronous with respect to a common clock and control inputs. All inputs for ports 0 / 1 are latched on the rising CLK edge of the port 0 / 1 clock input. All inputs for ports 2 / 3 are latched on the rising CLK edge of the port 2 / 3 clock input. Port pairs 0 / 1 and 2 / 3 are time-multiplexed by their respective clock inputs. Port 0 access is active when the CLK input for ports 0 / 1 is high, port 1 is active when the same clock input is low. Likewise, port 2 is active when the CLK input for ports 2 / 3 is high and port 3 is active when the same clock input is low. Output data is then re-timed in a pipeline cycle and is presented to the outputs relative to the respective rising clock edge. Described is a synchronous time-shared access technique that is dependent on the clock duty cycle (duration of the clock high period and clock low period) with half of the memory accesses occurring while the clock is high and the other half occurring while the clock is low.

The problem is to develop a practical, high-speed, low-power and area efficient read port structure to allow multiple (e.g., eight) random access reads per clock cycle. The straight forward implementation of multiple physical ports throughout the memory would be prohibitively complex and inefficient.

SUMMARY OF THE INVENTION

It is an object of the present invention to provide an improved multi-port RAM (random access memory).

In accordance with one aspect of the present invention, there is provided a multi-port RAM comprising: store means for storing data, the store means including an array of m rows by n columns of RAM cells, with N read ports; and addressing means for generating M address signals of X- and Y-addresses in response to an input clock signal and an input address signal of address information, the M address signals being generated during one clock cycle of the input clock signal and being different in phase from each other, the X- and Y-addresses of each of the M address signals identifying the row and column of the array of the RAM cell, respectively.

In an example of the multi-port RAM, the addressing means comprises clock generating means for generating first and second control clock signals in response to the input clock signal. It further comprises address generating means for generating the address signals of the X- and Y-addresses in response to the first and second control clock signals, respectively.

In an example of the multi-port RAM, the self-timed, time multiplexed read port control is implemented in a four physical port structure. It allows the eight read ports to be implemented as four physical port structures accessed twice per clock cycle. The value of M is two: i.e., two accesses per clock cycle. No special control or clocking is required externally to the RAM cell, since all timing is internally generated from a single rising clock transition. The core cell may be a dynamic random access memory cell or a static random access memory cell.

BRIEF DESCRIPTION OF THE DRAWINGS

An embodiment of the present invention will now be described by way of example with reference to the accompanying drawings in which.

DETAILED DESCRIPTION

I. Structure of an Embodiment Multi-Port RAM (random access memory)

The structure of a multi-port RAM of an embodiment according to the present invention will now be described.

Referring to FIGS. 1A–1D, a multi-port RAM has a core cell array 110 of m (=48) rows by n (=64) columns with one write port and four read ports. The core cell array 110 is connected to word lines 112 and bit lines 114. Control circuits for the write port are not shown. Each RAM cell of the core cell array 110 is a dynamic or static storage element. The word lines 112 are connected to the row decode circuit 116. The address identifying the core cell for data reading in the core cell array 110 is determined by X- and Y-address signals which are provided by a row decode circuit 116 and a column decode circuit 118, respectively.

The row decode circuit 116 has 192 row decoders (4 ports per row, 48 rows). The bit lines 114 are connected to a bit line access circuit 120 which has 256 column access circuits (4 ports per column, 64 columns; 8 columns per bit, 4 data buses per bit). The address data is contained in an address signal which is present on an address input bus 122, the address signal having X- and Y-address data. The address input bus 122 is an 8 port×9-bit address input bus. The 8 ports are represented by "a"–"h". The Y-address data is fed to a Y-address circuit 124 via an 8 port (ports a–h)×3 bit (bits 0–2) bus. The X-address data is fed to an X-address circuit 126 via an 8 port (ports a–h)×6 bit (bits 3–8) bus.

Figure 1:
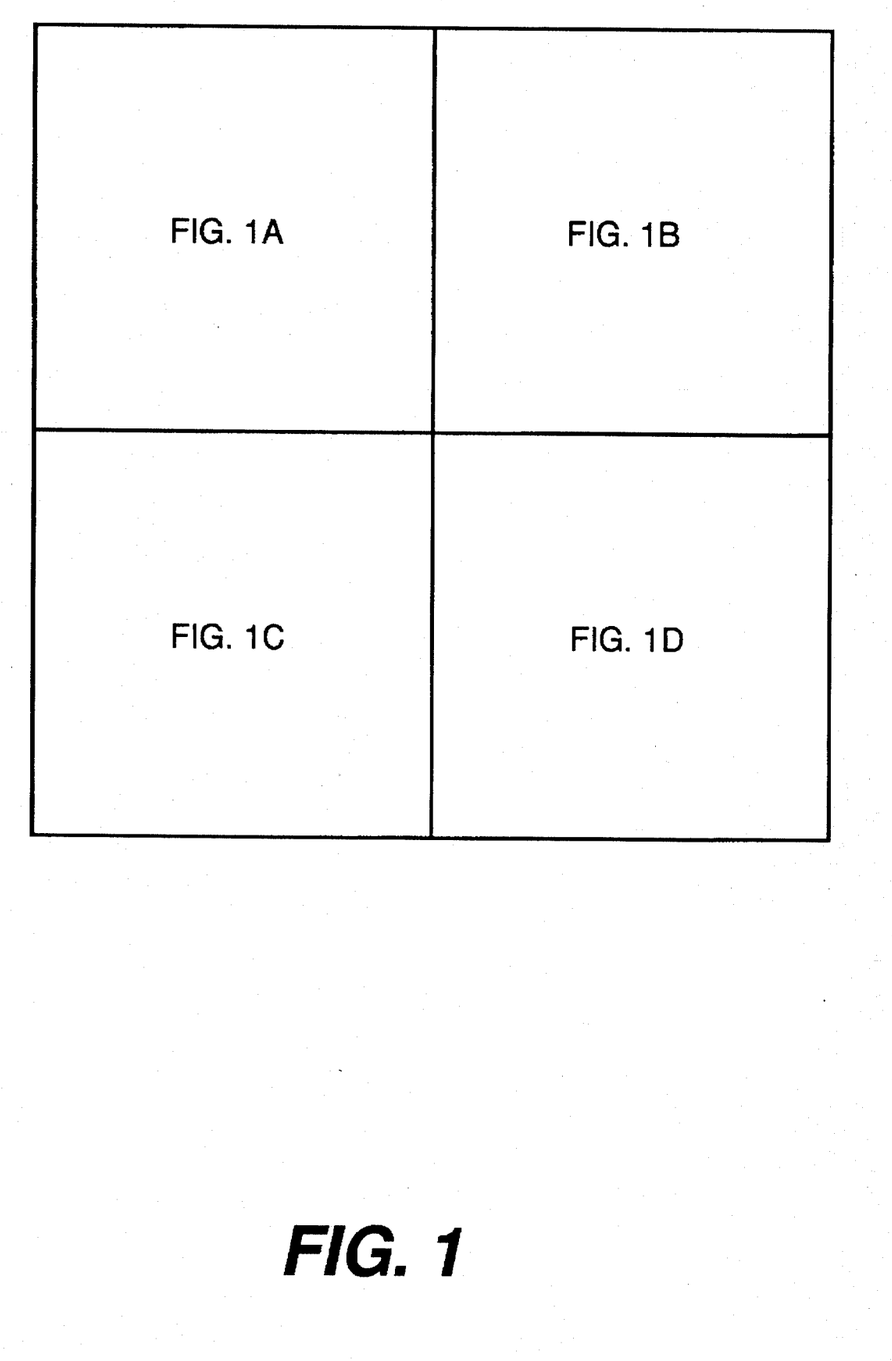
FIG. 1 shows the structure of FIGS. 1A–1D which illustrate a multi-port RAM (random access memory) according to an embodiment of the present invention.
Figure 1A:
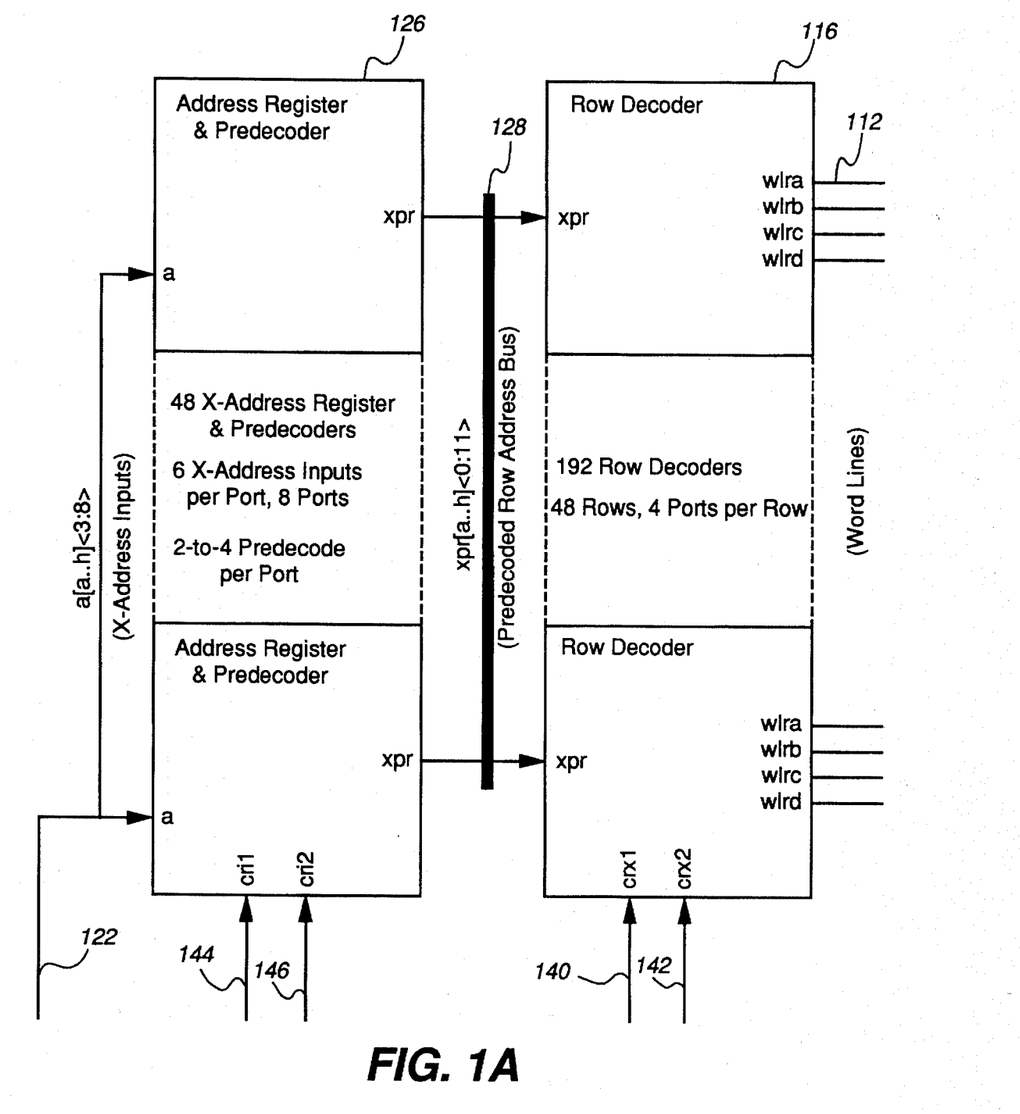
FIG. 1A is a block diagram of an X-address circuit and a row decode circuit which are included in the multi-port RAM.
Figure 1B:
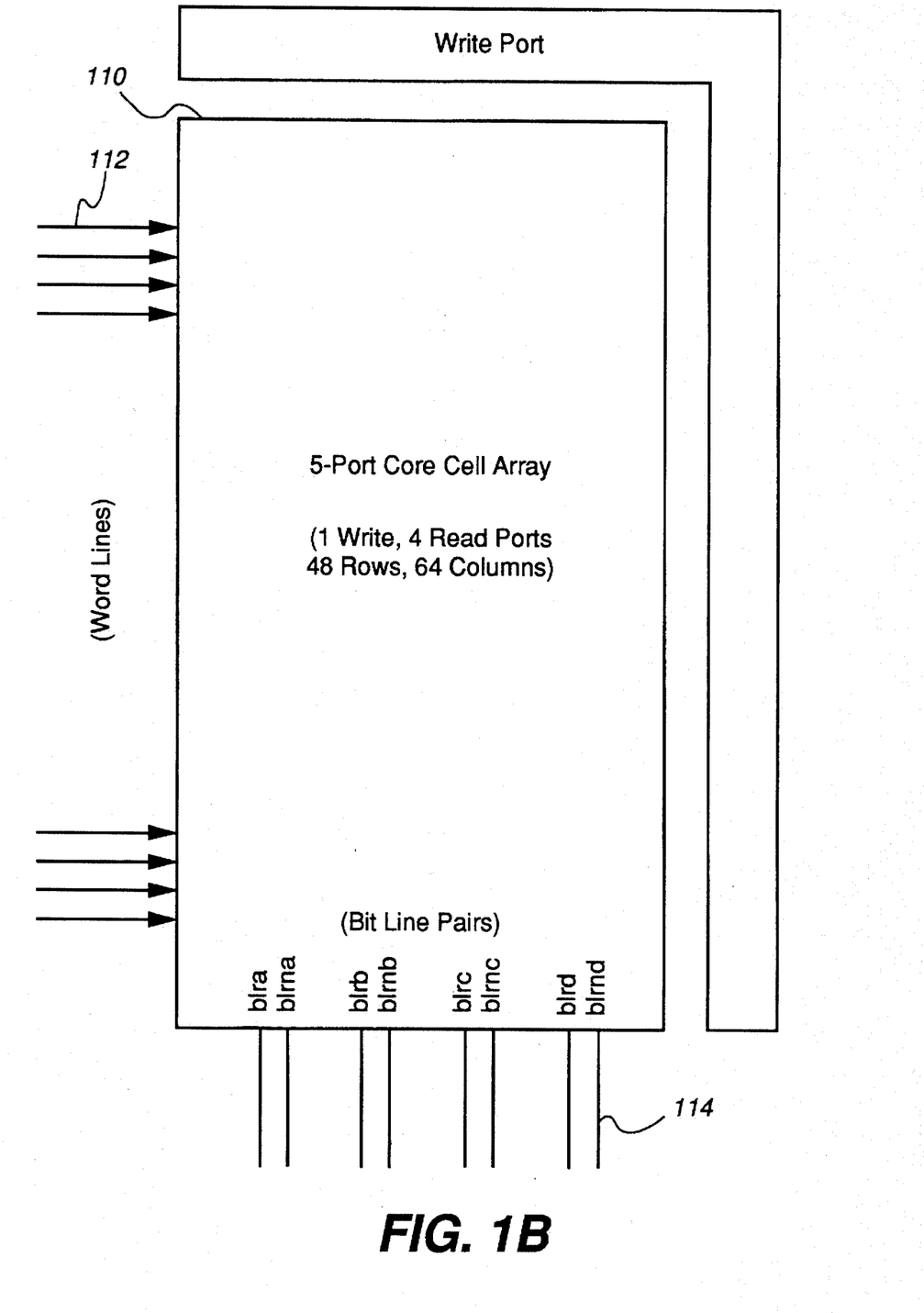
FIG. 1B is a block diagram of a multi-port core cell array which is included in the multi-port RAM.
Figure 1C:
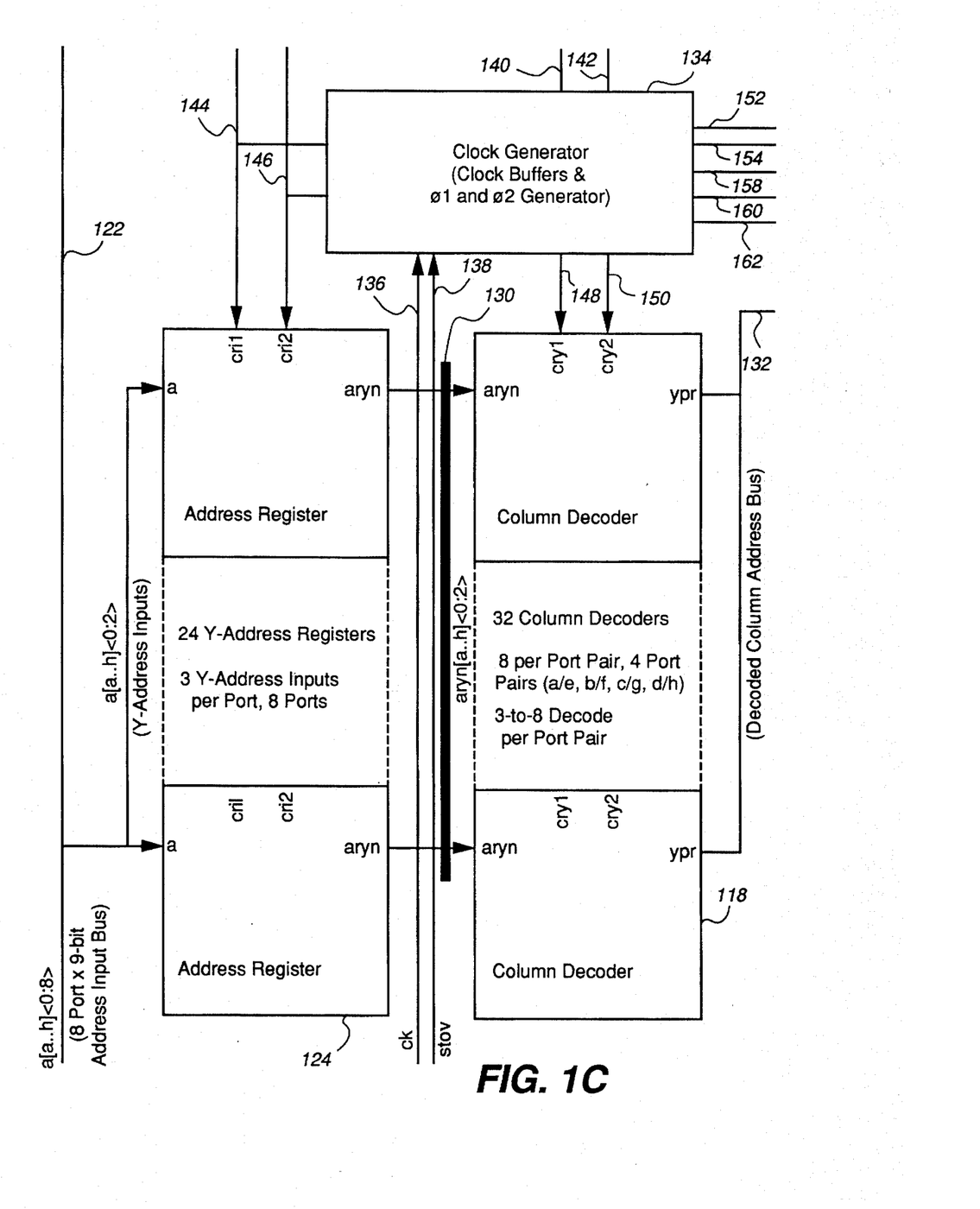
FIG. 1C is a block diagram of a Y-address circuit, a column decode circuit and a clock generator which are included in the multi-port RAM.

The Y-address circuit 124 has 24 Y-address registers (3 Y-address inputs per port, 8 ports). The X-address circuit 126 has 48 X-address register and predecoders (8 ports, 6 X-address inputs per port; 2-to-4 predecode per port). The X-address circuit 126 is connected to the row decode circuit 116 via a predecoded row address bus 128. The Y-address circuit 124 is connected via a column address bus 130 to the column decode circuit 118 which is connected to the bit line access circuit 120 via a decoded column address bus 132 having decoded Y-address lines. The column decode circuit 118 has 32 column decoders (8 per port pair, 4 port pairs (a/e, b/f, c/g, d/h); 3-to-8 decode per port pair).

Timing of addressing is controlled by a clock generator 134 which is a self-timed, time multiplex control circuit. A clock input line 136 to which a system clock signal ck is fed by a clock source (not shown) is connected to the clock generator 134. Also, a mode line 138 to which a self-timing override mode signal stov is fed by a signal source (not shown) is connected to the clock generator 134. The clock generator 134 generates clock signals of two phases φ1 and φ2 and doubles the frequency of the clock signal by multiplexing. Multiplex control clock signals crx1 and crx2 from the clock generator 134 are fed to the row decode circuit 116 via multiplex clock lines 140 and 142, respectively. Interface clock signals cri1 and cri2 from the clock generator 134 are fed to both the Y-address circuit 124 and the X-address circuit 126 via interface clock lines 144 and 146, respectively. Multiplex control clock signals cry1 and cry2 from the clock generator 134 are fed to the column decode circuit 118 via multiplex clock lines 148 and 150, respectively.

Figure 1D:
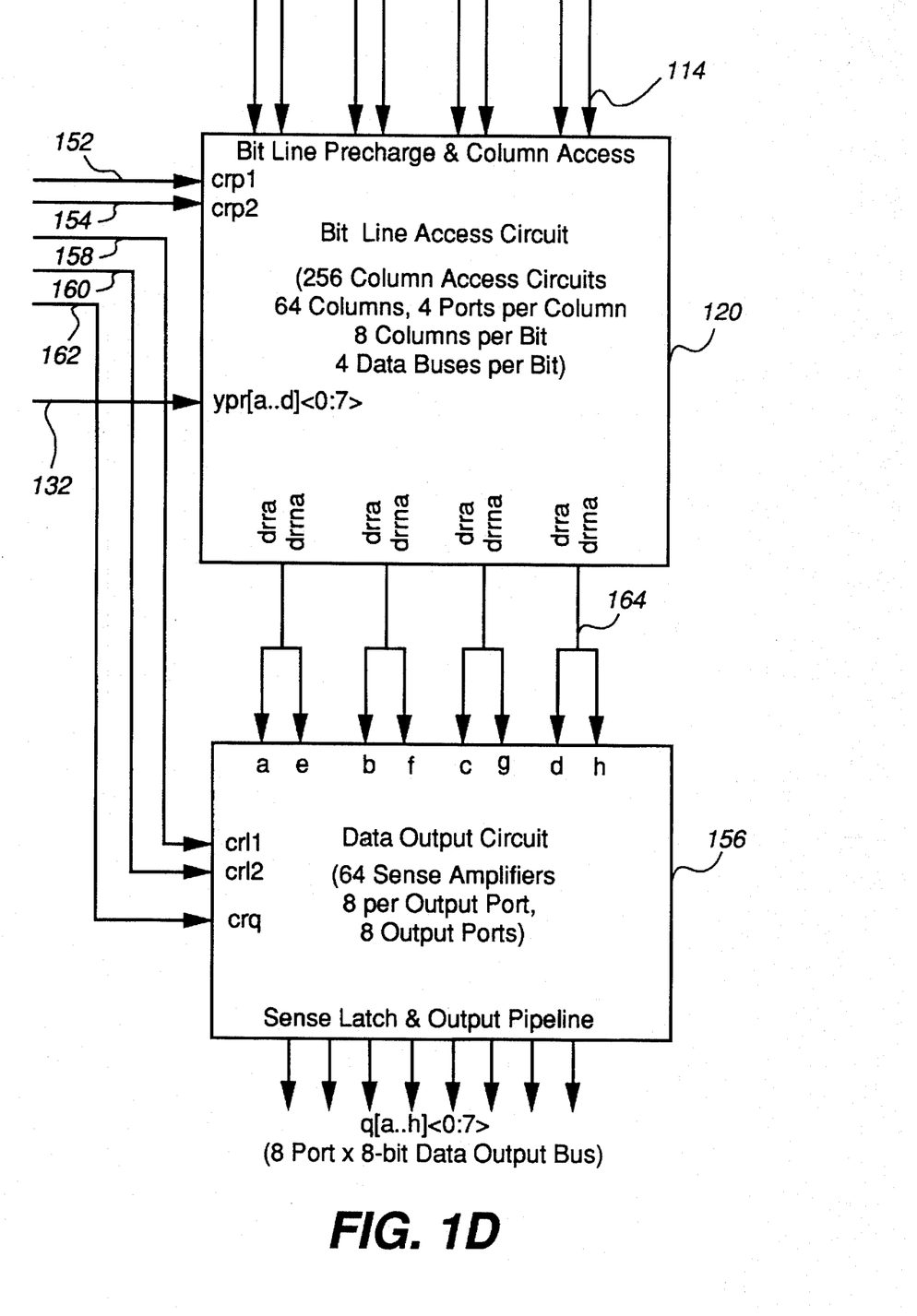
FIG. 1D is a block diagram of a bit line access circuit and a data output circuit which are included in the multi-port RAM.

A φ1 precharge clock signal crp1 and a φ2 precharge clock signal crp2 are provided by the clock generator 134 to the bit line access circuit 120 via precharge lines 152 and 154, respectively. A φ1 sense amp latch clock signal crl1, a φ2 sense amp latch clock signal crl2 and an output register clock signal crq are provided by the clock generator 134 to a data output circuit 156 via a sense clock line 158, a sense clock line 160 and a register clock line 162, respectively. The data output circuit 156 has 64 sense amplifiers (8 per output port, 8 output ports,) and is connected to an 8 port ×8-bit data output bus. The data buses 164 from the bit line access circuit 120 are connected to the data output circuit 156.

Figure 2:
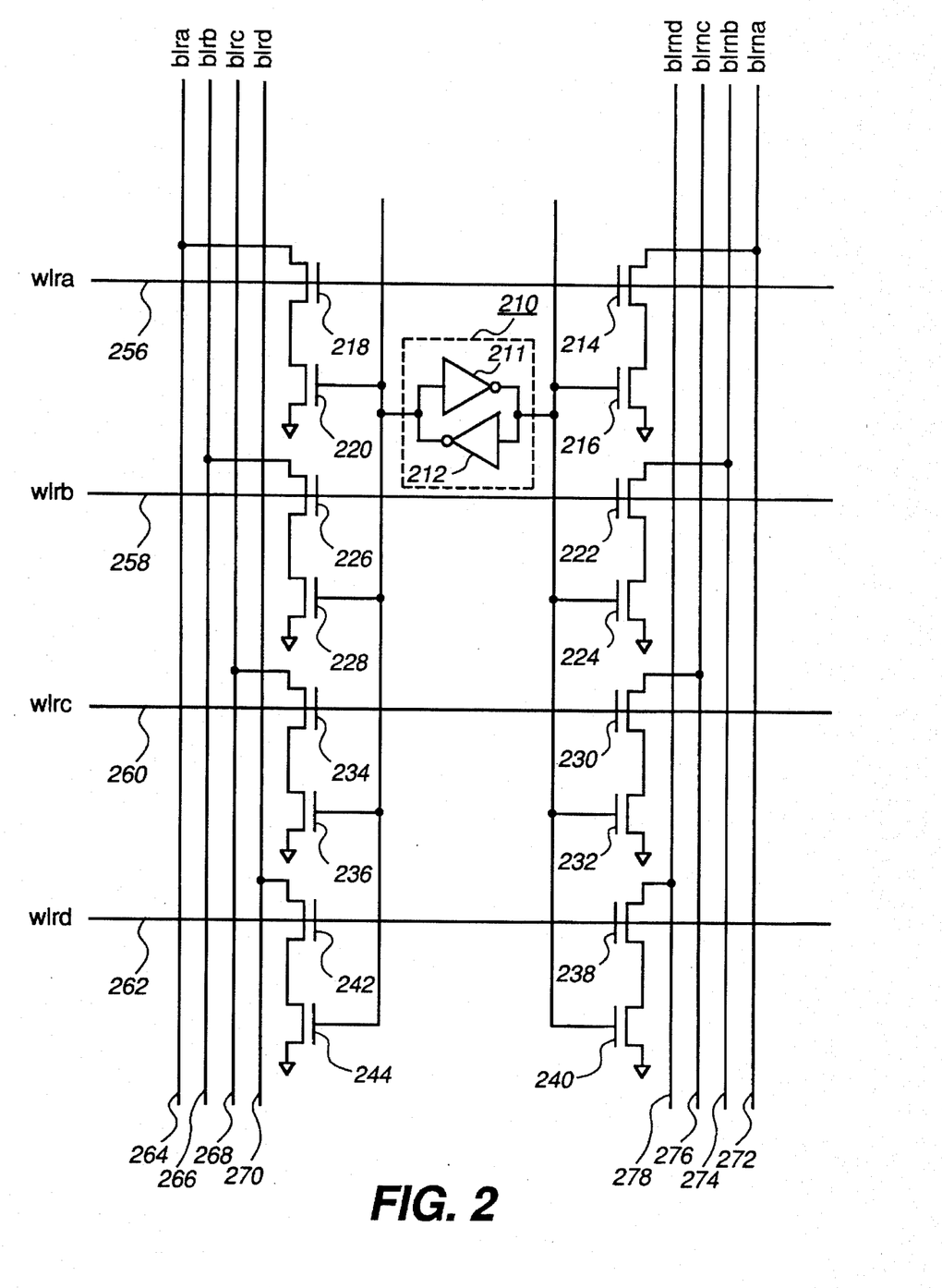
FIG. 2 is a detailed circuit diagram of a RAM cell of the core cell array shown in FIG. 1B.

FIG. 2 shows a RAM cell of the core cell array 110. The RAM cell has a five-port storage element and includes one write port and four differential read ports with indirect data access. Data write circuits are not shown. The RAM cell has a latch 210 which includes two inverters 211 and 212 which comprises CMOS (complementary metal oxide semiconductor) inverters.

The source of a FET 214 is connected to the drain of a FET 216. The source of a FET 218 is connected to the drain of a FET 220. The sources of the FETs 216 and 220 are connected to the ground terminal. Circuit configuration of FETs 222–244 is identical to that of the FETs 214–220.

The output terminal of the inverter 211 and the input terminal of the inverter 212 are connected to the gates of the FETs 216, 224, 232 and 240. The input terminal of the inverter 211 and the output terminal of the inverter 212 are connected to the gates of the FETs 220, 228, 236 and 244.

A line 256 on which a word line read signal wlra is present is connected to the gates of the FETs 214 and 218. A line 258 on which a word line read signal wlrb is present is connected to the gates of the FETs 222 and 226. A line 260 on which a word line read signal wlrc is present is connected to the gates of the FETs 230 and 234. A line 262 on which a word line read signal wlrd is present is connected to the gates of the FETs 238 and 242.

The drains of the FETs 218, 226, 234 and 242 are connected to bit lines 264, 266, 268 and 270, respectively, on which read bit line signals blra, blrb, blrc and blrd are present. The drains of the FETs 214, 222, 230 and 238 are connected to bit lines 272, 274, 276 and 278, respectively, on which read bit line signals blrna, blrnb, blrnc and blrnd are present. The bit lines 264 and 272, 266 and 274, 268 and 276, 270 and 278 are pairs of bit lines and on the respective pairs, the read bit line signals blra and blrna, blrb and blrnb, blrc and blrnc, and blrd and blrnd are which are differential signals are present.

A detailed structure and operation of the RAM core array are described in co-pending U.S. patent application No. 08/565,267 entitled "Multi-Port SRAM Core Array" filed by the same inventors on Nov. 30, 1995, which claims priority from U.S. provisional application No. 60/001,578 filed on Jul. 27, 1995, which is incorporated herein by reference.

Figure 3:
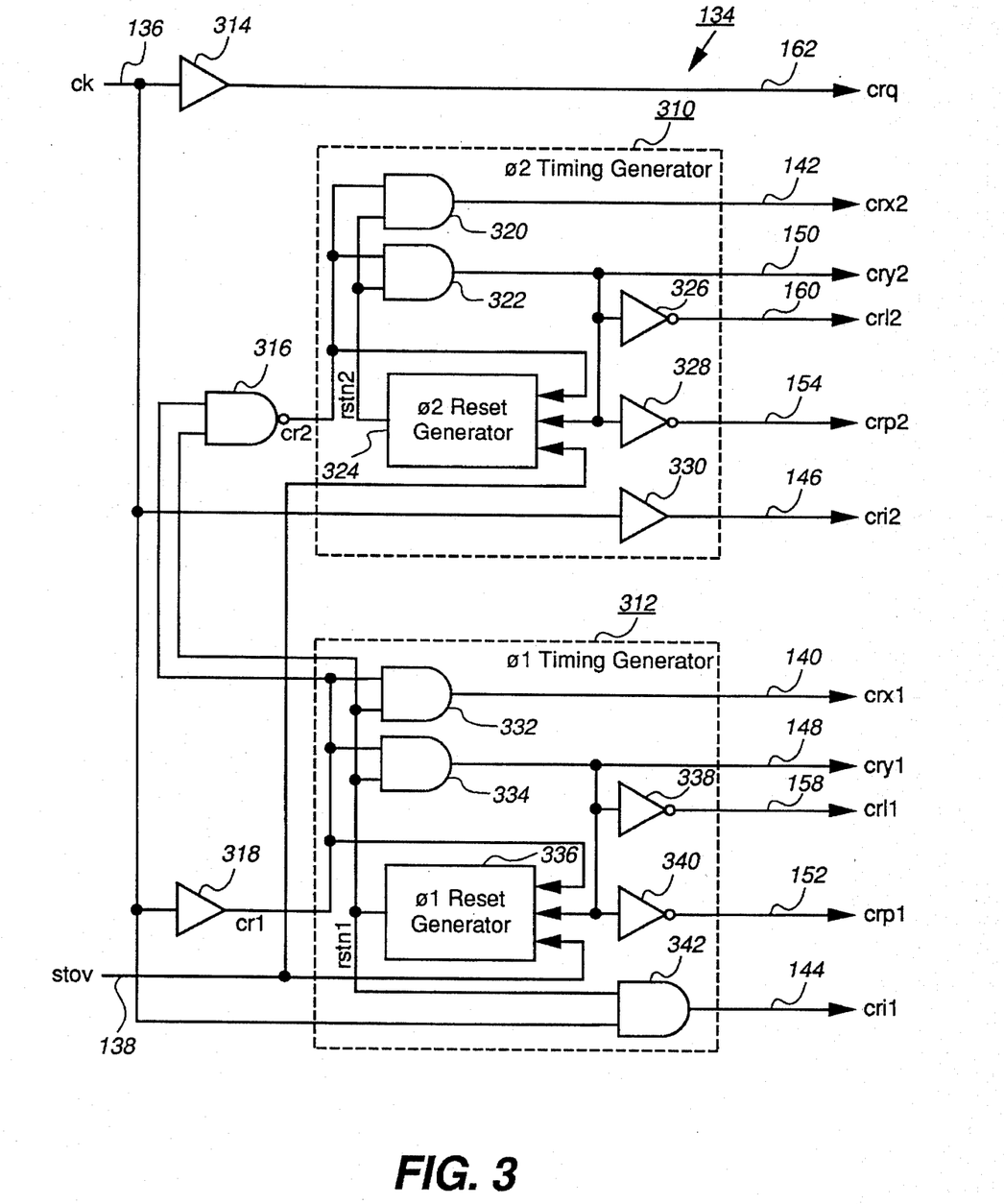
FIG. 3 is a detailed block diagram of the clock generator shown in FIG. 1C.

Referring to FIG. 3 which shows the clock generator 134 in detail, it has a φ2 timing generator 310, a φ1 timing generator 312, a buffer 314, a NAND gate 316 and a buffer 318. The clock input line 136 to which the system clock signal ck is fed is connected to the φ2 timing generator 310 and the φ1 timing generator 312 and to input terminals of the buffers 314 and 318. The mode line 138 to which the self-timing override mode signal stov is fed is connected to the φ2 timing generator 310 and the φ1 timing generator 312. The buffer 314 delays the system clock signal ck and provides the output register clock signal crq on the register clock line 162. The buffer 318 delays the system clock signal ck and provides a φ1 read clock signal crl. The output terminal of the buffer 318 is connected to the φ1 timing generator 312 and the NAND gate 316. The φ2 timing generator 310 has two AND gates 320 and 322, a φ2 reset generator 324, two inverters 326 and 328 and a buffer 330.

The φ1 timing generator 312 has two AND gates 332 and 334, a φ1 reset generator 336, two inverters 338 and 340 and an AND gate 342. The clock input line 136 is connected to the buffer 330 and the AND gate 342. The buffer 330 delays the system clock signal ck and provides the interface clock signal cri2 on the interface clock line 146. The output terminal of the buffer 318 is connected to the NAND gate 316, the AND gate 332, the AND gate 334 and the φ1 reset generator 336. The output terminal of the NAND gate 316 is connected to the AND gates 320 and 322 and the φ2 reset generator 324. The output terminal of the AND gate 322 is connected to the φ2 reset generator 324 and the inverters 326 and 328. The output terminal of the AND gate 334 is connected to the φ1 reset generator 336 and the inverters 338 and 340.

The self-timing override mode signal stov is fed to the φ1 and the φ2 reset generators 336 and 324. The override mode signal stov is a diagnostic mode control input signal and it is "high" and "low" in normal and diagnostic modes, respectively.

The φ1 reset generator 336 provides a φ1 reset control signal rstn1 on its output terminal which is connected to the NAND gate 316 and the AND gates 332, 334 and 342. The NAND gate 316 provides a φ2 read clock signal cr2 which is a NAND logic signal of the φ1 read clock signal cr1 and the φ1 reset control signal rstn1. The φ2 reset generator 324 provides a φ2 reset control signal rstn2 on its output terminal which is connected to the AND gates 320 and 322. The AND gate 320 provides the multiplex control clock signal crx2 on the multiplex clock line 142. The multiplex control clock signal crx2 is an AND logic signal of the φ2 read clock signal cr2 and the φ2 reset control signal rstn2. The AND gate 322 provides the multiplex control clock signal cry2 on the multiplex clock line 150. The multiplex control clock signal cry2 is an AND logic signal of the φ2 read clock signal cr2 and the φ2 reset control signal rstn2. The inverter 326 provides the φ2 sense amp latch clock signal crl2 on the sense clock line 160. The φ2 sense amp latch clock signal crl2 is an inverted signal of the multiplex control clock signal cry2. The inverter 328 provides the φ2 precharge clock signal crp2 on the precharge line 154. The φ2 precharge clock signal crp2 is an inverted signal of the multiplex control clock signal cry2. The AND gate 332 provides the multiplex control clock signal crx1 on the multiplex clock line 140. The multiplex control clock signal crx1 is an AND logic signal of the φ1 read clock signal cr1 and the φ1 reset control signal rstn1. The AND gate 334 provides the multiplex control clock signal cry1 on the multiplex clock line 148. The multiplex control clock signal cry1 is an AND logic signal of the φ1 read clock signal cr1 and the φ1 reset control signal rstn1. The inverter 338 provides the φ1 sense amp latch clock signal crl1 on the sense clock line 158. The φ1 sense amp latch clock signal crl1 is an inverted signal of the multiplex control clock signal cry1. The inverter 340 provides the φ1 precharge clock signal crp1 on the precharge line 152. The φ1 precharge clock signal crp1 is an inverted signal of the multiplex control clock signal cry1. The AND gate 342 provides the interface clock signal cri1 on the interface clock line 144. The interface clock signal cri1 is an AND logic signal of the system clock signal ck and the φ1 reset control signal rstn1.

Figure 4:
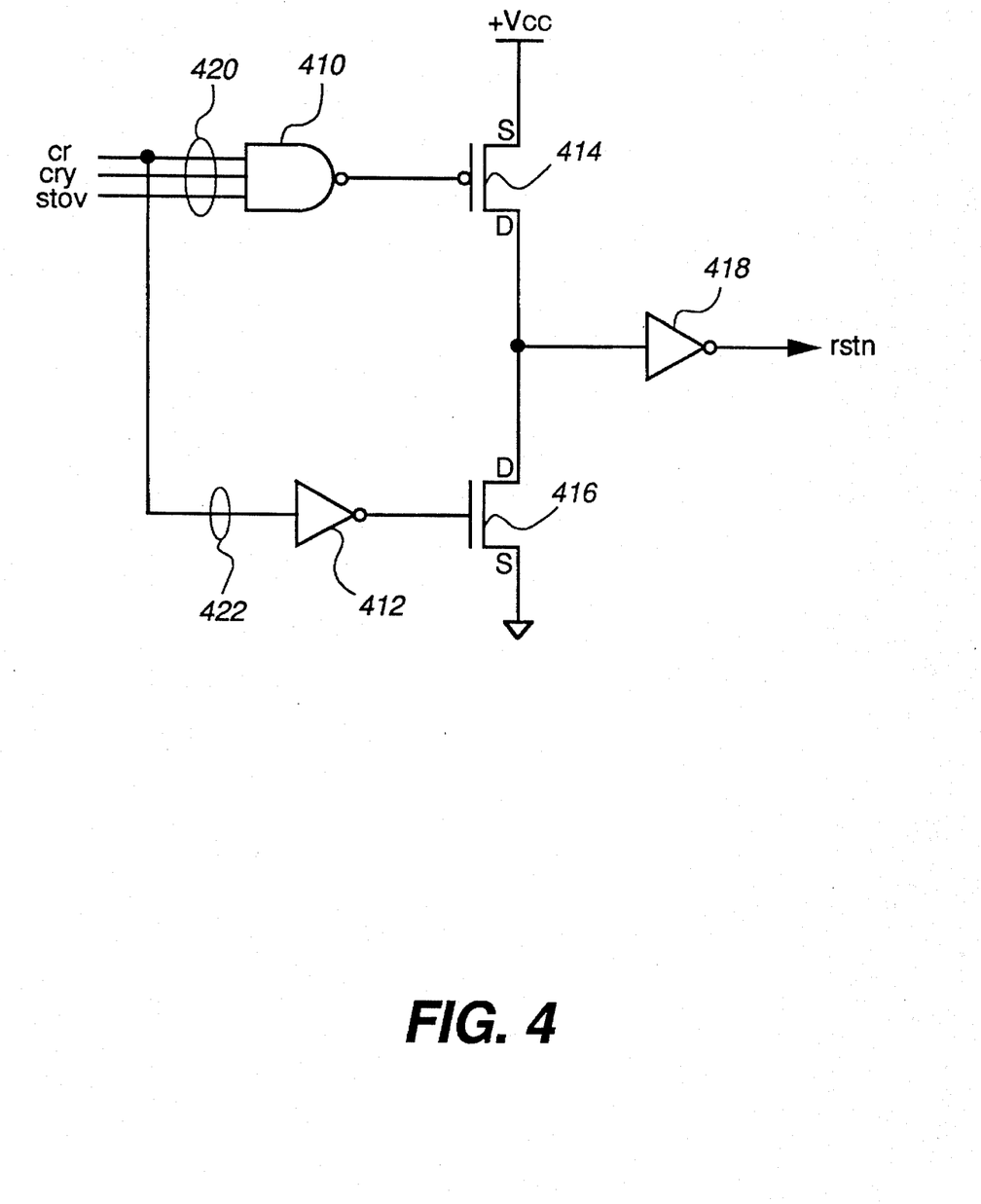
FIG. 4 is a detailed circuit diagram of the reset generators shown in FIG. 3.

FIG. 4 is a detailed circuit diagram of the φ2 reset generator 324 and the φ1 reset generator 336 which have an identical circuit. In FIG. 4, each of the generators is a self-timing reset generator having a NAND gate 410, an inverter 412, a P-channel FET 414, an N-channel FET 416 and an inverter 418. The input terminals of the NAND gate 410 are connected to lines comprised in a set input bus 420 to which the read clock signal cr (the φ1 or φ2 read clock signals cr1 or cr2), the multiplex control clock signal cry (the multiplex control clock signals cry1 or cry2) and the override mode signal stov are provided. The input terminal of the inverter 412 is connected to a reset input line 422 to which the read clock signal cr is provided. The output terminal of the NAND gate 410 is connected to the gate of the P-channel FET 414, the source of which is connected to the voltage supply terminal of a positive voltage +VCC. The output terminal of the inverter 412 is connected to the gate of the N-channel FET 416, the drain and source of which are connected to the drain of the P-channel FET 414 and the ground terminal, respectively. The drains of the FETs 414 and 416 are connected to an input terminal of the inverter 418 which provides a reset control signal rstn (the φ1 or the φ2 reset control signals rstn1 or rstn2).

II. Operation of the Embodiment

Figure 5:
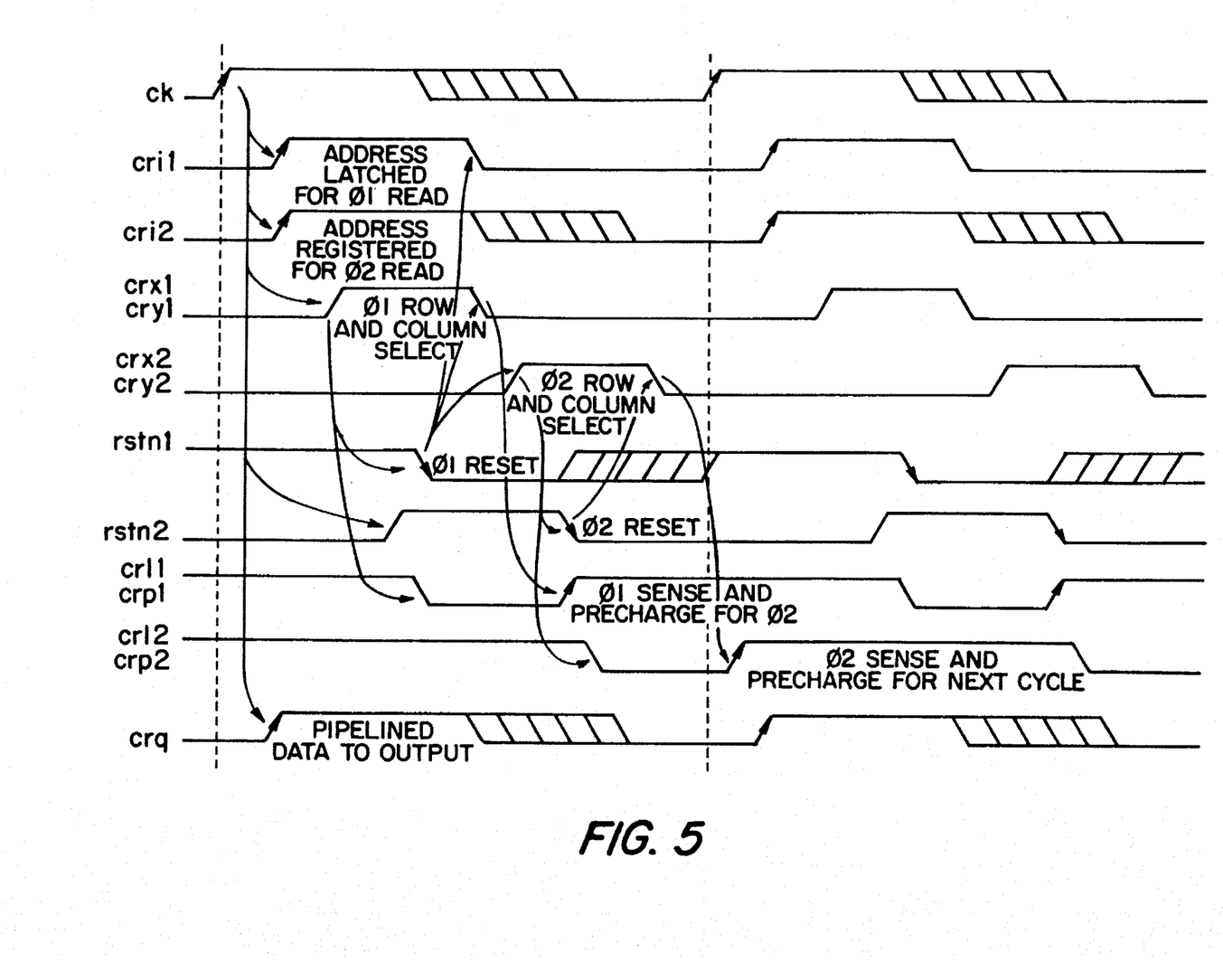
FIG. 5 is a timing chart which illustrates the operation of the multi-port RAM.

FIG. 5 is a timing chart which illustrates the operation of the multi-port RAM. Operation of the embodiment will now be described with reference to the drawings.

(i) Read Port Access

Time multiplexing is employed in order to create eight data accesses from the four physical read ports in the core cell array 110. Every read cycle is divided into two phases: phase 1 (φ1) and phase 2 (φ2). Phase 1 (φ1) accesses provide data for four ports a–d. Phase 2 (φ2) accesses provide data for four ports e–h. The multiplexed read architecture can be seen clearly through the convergence of the port address signal paths on the core, and the divergence of the four data paths in the sense amplifier and output stages.

The eight read ports are fully synchronous with respect to the single clock of the system clock signal ck which is present on the clock input line 136. An internal self-timing mechanism is employed to generate the time multiplex control signals with minimum average power dissipation, regardless of the read clock frequency, duty-cycle, process or operating conditions.

The self-timed, time multiplex control signal timing sequence is shown in FIG. 5. Operation of a complete cycle is described below with all steps associated with the time division multiplex read port function.

The rising edge of the system clock signal ck triggers the output register clock signal crq. In response to the output register clock signal crq which is provided in the register clock line 162, the read data path output from the previous cycle is registered in the data output circuit 156. The rising edge of the system clock signal ck initiates the two interface clock signals cri1 and cri2 to latch the eight port address inputs. The interface clock signal cri1 is provided by the φ1 timing generator 312 to the X-address circuit 126 and the Y-address circuit 124 via the interface clock line 144. The interface clock signal cri2 is provided by the φ2 timing generator 310 to the X-address circuit 126 and the Y-address circuit 124 via the interface clock line 146.

The rising edge of the system clock signal ck initiates the multiplex control clock signals crx1 and cry1, which are provided by the φ1 timing generator 312 to the row decode circuit 116 and the column decode circuit 118 via the multiplex clock lines 140 and 148, respectively. In response to the multiplex control clock signal crx1, the φ1 X-addresses (wlr) are selected by the row decode circuit 116. The selected φ1 X-addresses are provided to the word lines 112. Similarly, in response to the multiplex control clock signal cry1, the φ1 Y-addresses (ypr) are selected by the column decode circuit 118. The selected φ1 Y-addresses are provided to the decoded column address bus 132. This accomplishes the φ1 row and column select function. The rising edge of the system clock signal ck sets the φ2 reset control signal rstn2, thereby arming the φ2 clock generation circuitry for subsequent generation of the φ1 reset.

The rising edge of the multiplex control clock signal cry1 triggers the φ1 sense amp latch clock signal crl1 to provide equalization and data access and to re-time φ1 and φ2 data from the previous cycle. The internal self-timing loop feedback path then causes a falling edge on the φ1 reset control signal rstn1. The falling edge of the φ1 reset control signal rstn1 resets the multiplex control clock signals crx1 and cry1. In response to the reset, the port a–d predecoded address lines are reconnected to the address input path and the φ1 row and column addresses are deselected from the word lines 112 and the decoded Y-address lines of the decoded column address bus 132.

The falling edge of the multiplex control clock signal cry1 resets the φ1 sense amp latch clock signal crl1 to initiate latching and the φ1 precharge clock signal crp1 to equalize the data bus and bit lines for the subsequent φ2 read.

The falling edge of the φ1 reset control signal rstn1 initiates the φ2 cycle by enabling the armed multiplex control clock signals crx2 and cry2. The rising edges of the multiplex control clock signal crx2 and the multiplex control clock signal cry2 gate the φ2 X-addresses to the word lines 112 and the φ2 Y-addresses to the decoded Y-address lines. This accomplishes the φ2 row and column select function. The rising edge of the multiplex control clock signal cry2 triggers the φ2 sense amp latch clock signal crl2 to provide equalization and data access. The internal self-timing loop feedback path then causes a falling edge on the φ2 reset control signal rstn2.

The falling edge of the φ2 reset control signal rstn2 resets the multiplex control clock signals crx2 and cry2. In response to the reset, the port e–h predecoded address lines are reconnected to the address input path and the φ2 row and column addresses are deselected from the word lines 112 and decoded Y-address lines. The falling edge of the multiplex control clock signal cry2 resets the φ2 sense amp latch clock signal crl2 to initiate latching and the φ2 precharge clock signal crp2 to equalize the data bus and bit lines for the subsequent φ1 read. The falling edge of the system clock signal ck resets the φ1 reset control signal rstn1, thereby re-arming the φ1 clock generation circuitry for subsequent generation of the next rising clock cycle.

In response to the X- and Y-addresses, the data stored in the cell in the row and column is read. For example, while the word line read signal wlra on the line 256 is "high", the FETs 218 and 214 are gated. A "zero" or "one" data stored in the latch 210 is read through the FETs 220, 218 and 216, 214 between the read bit lines 264 and 272.

(ii) Self-timed, Time Multiplex Control

Self-timed, time multiplex control signals are provided by the clock generator 134 which is shown in detail in FIG. 3. In the clock generator 134, there are two self-timing loops controlling the time multiplexed operations. The first loop, which is for the φ1 timing generation and reset and includes the signal paths of the φ1 read clock signal cr1, the multiplex control clock signal cry1 and the φ1 reset control signal rstn1 (a φ1 self-timing loop), includes the path of the AND gate 334 AE the φ1 reset generator 336. The second loop, whose operation is triggered by the first through the NAND gate 316, is for the φ2 timing generation and reset. The second loop includes the paths of the φ2 read clock signal cr2, the multiplex control clock signal cry2 and the φ2 reset control signal rstn2 and the path of the AND gate 322 AE the φ2 reset generator 324.

Operation of the timing loop is as follows. It is assumed that the system clock signal ck is "low". A new cycle is about to be initiated and the override mode signal stov is "high". In this case, the φ1 read clock signal cr1 is "low" and the φ2 read clock signal cr2 is "high". This causes the φ2 reset control signal rstn2 to be "low" and the φ1 reset control signal rstn1 to be "high". The "high" level on the φ1 reset control signal rstn1 arms the AND gates 332 and 334 which are in the φ1 clock paths. The "low" level on the φ2 reset control signal rstn2 disarms the AND gates 320 and 322 and the φ2 clock paths. The multi-port RAM is now in a "ready state" for the cycle to begin.

On the rising edge of the system clock signal ck, the interface clock signals cri1 and cri2 fire to latch the interface data in the address registers and sequence the φ1 interface operation. The multiplex control clock signals crx1 and cry1, the φ1 sense amp latch clock signal crl1 and the φ1 precharge clock signal crp1 all fire to sequence the x-decode, the y-decode and the data path operation. The φ1 self-timing loop is also triggered and the rising edge of the multiplex control clock signal cry1 feeds back through the φ1 reset generator 336, forcing the φ1 reset control signal rstn1 "low". The falling edge of the φ1 reset control signal rstn1 shuts down all φ1 clocks ending the φ1 cycle. The φ1 reset generator has a tuned delay which allows all φ1 operations to complete before shut down.

The rising edge of the system clock signal ck also causes the φ2 read clock signal cr2 to fall, since the φ1 reset control signal rstn1 is "high". The falling edge of the φ2 read clock signal cr2 will cause the φ2 reset generator 324 to be cleared and the φ2 reset control signal rstn2 will go "high", arming the φ2 clock path.

The falling edge of the φ1 reset control signal rstn1 is used as the trigger to start the φ2 timing generator 310 via the NAND gate 316. The falling edge of the φ1 reset control signal rstn1 causes the φ2 read clock signal cr2 to rise. It causes all φ2 clocks, the multiplex control clock signals crx2 and cry2, the φ2 sense amp latch clock signal crl2 and the φ2 precharge clock signal crp2 to transit their state. As with φ1, the rising edge of the multiplex control clock signal cry2 feeds back through the φ2 reset generator 324, forcing the φ2 reset control signal rstn2 "low". The falling edge of the φ2 reset control signal rstn2 shuts down all φ2 clocks ending the φ2 cycle.

Additional multiplex phases may be added following the φ2 circuitry with the φ2 read clock signal cr2 and the φ2 reset control signal rstn2 feeding the φ3 timing generator, etc.

The falling edge of the system clock signal ck will once again force the φ1 reset control signal rstn1 "high" in preparation for the next cycle. It should be noted that the minimum system clock signal ck "high" period is limited by the length of the φ1 cycle. That is, the system clock signal ck should not be taken "low", before the φ1 reset control signal rstn1 goes "low" or the φ1 cycle may be corrupted.

(iii) Self-Timing Override

A self-timing override mode is provided for the two phase version of the control circuit. By asserting the override mode signal stov "low", the reset circuit operation is disabled and the φ1 and the φ2 reset control signals rstn1 and rstn2 are latched in a "high" state. One rising clock edge is required to force the φ2 reset control signal rstn2 "high", once the override mode signal stov is asserted, the φ1 reset control signal rstn1 is set "high" during the system clock signal ck "low" and remains "high" until the override mode signal stov is released.

With both the φ1 and the φ2 reset control signals rstn1 and rstn2 "high", both the φ1 and φ2 clock paths are armed. The φ1 clocks fire on the rising edge of the system clock signal ck and the φ2 clocks fire on the falling edge. This allows the φ1 and the φ2 cycles to be controlled externally by the duty cycle of the clock for test and debug purposes. This function is not scalable to more phases than two in the embodiment, since the clock input has only two phases.

The innovative feature of the multi-port RAM is the self-timed, time multiplexed read port control which allows the eight read ports to be implemented as four physical port structures accessed twice per clock cycle. No special control or clocking is required externally to the memory since all timing is internally generated from the single rising clock transition. In the multi-port RAM, all ports are fully synchronous with respect to a single clock input. No arbitration between ports is required, since the timing generator has a fixed sequence. The clock must only be "high" or "low" for minimum periods set by the control circuit. The actual timing of the memory operation is generated by the self-timed control circuitry which only requires the rising clock edge as a trigger. Once initiated, the self-timed circuitry completes the M accesses as quickly as possible (in sequence) and then disables the memory in preparation for the next cycle. This technique has two major advantages: 1) the architecture is scalable to many self-timed access phases (M>2) and 2) the memory shut-down at faster process conditions significantly reduces power consumption, since the circuit is only active for as long as needed to complete the function.

One significant advantage of this multi-port RAM is that it is scalable. Although it has been implemented for an eight port function where four physical ports are time multiplexed to give an eight port function there is no reason, for example, that a three port function could not be realized from one physical port if three cycles of multiplexing were used. Any number of timing phases may be added in sequence.

The row and column identification implemented into the read-port may be applied to the control circuits for the write port also. In such a write-port implementation, the address identifying the core cell for data storing in the core cell array 110 is determined by X- and Y-address signals which are provided by the row decode circuit 116 and the column decode circuit 118, respectively. Furthermore, the row and column identification may be implemented into both the read-port and the write-port and the core cell for data storing and reading in the core cell array 110 are determined by X- and Y-address signals.

Although particular embodiments of the present invention have been described in detail, it should be appreciated that numerous variations, modifications, and adaptations may be made without departing from the scope of the present invention as defined in the claims.

What is claimed is:

1. A multi-port RAM (random access memory) comprising:

store means for storing data, the store means including an array of m rows by n columns of RAM cells, with N read ports; and addressing means for generating M address signals of X- and Y-addresses in response to an input clock signal and an input address signal of address information, the M address signals being generated during one clock cycle of the input clock signal and being different in phase from each other, the X- and Y-addresses of each of the M address signals identifying the row and column of the array of the RAM cell, respectively.

2. The multi-port RAM of claim 1, wherein the addressing means comprises clock generating means for generating first and second control clock signals in response to the input clock signal.

3. The multi-port RAM of claim 2, further comprising address generating means for generating the address signals of the X- and Y-addresses in response to the first and second control clock signals, respectively.

4. The multi-port RAM of claim 3, wherein the address generating means includes means for converting the address information contained in the input address signal to the X- and Y-addresses in response to the first and second control clock signals, respectively.

5. The multi-port RAM of claim 2, wherein the clock generating means includes timing generating means for generating the first and second control clock signals M times during one clock cycle.

6. The multi-port RAM of claim 5, wherein the first and second control clock signals are generated at the same time.

7. The multi-port RAM of claim 5, wherein the timing generating means has M generators for generating the first and second control clock signals.

8. The multi-port RAM of claim 7, wherein each of the M generators generates the first and second control clock signals at the same time, the signal generation by the M generators occurring in different phases during one clock cycle.

9. The multi-port RAM of claim 5, wherein the timing generating means has first and second generators.

10. The multi-port RAM of claim 9, wherein:

the first generator generates the first and second control clock signals and a reset signal; and the second generator generates the first and second control clock signals in response to the reset signal, in which the generation of the first and second control clock signals is different in phase between the first and second generators.

11. The multi-port RAM of claim 1, wherein the number M of the address signals is two.

12. The multi-port RAM of claim 1, wherein the number N of the read ports of the cell is four.

13. The multi-port RAM of claim 1, wherein:

the number M of the address signals is two; and the number N of the read ports of the cell is four, in which the four read ports are accessed twice per clock cycle.

14. The multi-port RAM of claim 1, wherein data is stored in the RAM cell, the row and column of storing data being identified by the X- and Y-addresses, respectively.

15. The multi-port RAM of claim 1, wherein the data stored in the RAM cell is read, the row and column of reading data being identified by the X- and Y-addresses, respectively.

16. The multi-port RAM of claim 1, wherein data is stored in the RAM cell and read therefrom, the row and column of storing and reading data being identified by the X- and Y-addresses, respectively.

17. The multi-port RAM of claim 1, wherein the RAM cell is a dynamic random access memory cell.

18. The multi-port RAM of claim 1, wherein the RAM cell is a static random access memory cell.

\* \* \* \* \*